United States Patent
Hwang et al.

(10) Patent No.: US 8,653,521 B2
(45) Date of Patent: Feb. 18, 2014

(54) LIQUID CRYSTAL DISPLAY ARRAY SUBSTRATE AND METHOD FOR MANUFACTURING THE SAME

(75) Inventors: Jeongwoo Hwang, Chungbuk (KR); Yeonsu Jeong, Gyeongsangnam-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/546,710

(22) Filed: Jul. 11, 2012

(65) Prior Publication Data

US 2013/0234143 A1    Sep. 12, 2013

(30) Foreign Application Priority Data

Mar. 8, 2012    (JP) .......................... 10-2012-0023989

(51) Int. Cl.
*H01L 29/04*   (2006.01)
*G02F 1/136*   (2006.01)
*G02F 1/1343*  (2006.01)

(52) U.S. Cl.
USPC ................ 257/57; 349/46; 349/139; 349/141

(58) Field of Classification Search
USPC ....................... 257/57; 349/141, 46, 139, 143
See application file for complete search history.

(56) References Cited

U.S. PATENT DOCUMENTS

| | | | | |
|---|---|---|---|---|
| 2005/0078256 A1* | 4/2005 | Hong | ............................ | 349/141 |
| 2005/0174521 A1* | 8/2005 | Nishida et al. | ................ | 349/141 |
| 2006/0227273 A1* | 10/2006 | Shin et al. | ..................... | 349/139 |
| 2007/0153204 A1* | 7/2007 | Kim et al. | ..................... | 349/141 |
| 2009/0040449 A1* | 2/2009 | Jo et al. | ......................... | 349/143 |
| 2009/0207365 A1* | 8/2009 | Lee et al. | ....................... | 349/141 |
| 2009/0322975 A1* | 12/2009 | Song et al. | ...................... | 349/46 |
| 2011/0234936 A1* | 9/2011 | Yang et al. | ...................... | 349/46 |

* cited by examiner

*Primary Examiner* — Long K Tran
*Assistant Examiner* — Dzung Tran
(74) *Attorney, Agent, or Firm* — Birch, Stewart, Kolasch & Birch, LLP

(57) ABSTRACT

A liquid crystal display array substrate and a method for manufacturing the same are discussed. The liquid crystal display array substrate includes a gate line arranged on a substrate in one direction, a data line which crosses the gate line and defines a plurality of pixel areas, a thin film transistor formed at a crossing of the gate line and the data line, a pixel electrode connected to the thin film transistor, and a common electrode which is positioned opposite the pixel electrode and forms an electric field. The common electrode includes a shield line overlapping the data line, and the shield line includes at least two cutting portions having a width less than other portion of the shield line.

12 Claims, 9 Drawing Sheets

LIQUID CRYSTAL DISPLAY ARRAY SUBSTRATE AND METHOD FOR MANUFACTURING THE SAME

This application claims the priority benefit of Korean Patent Application No. 10-2012-0023989 filed on Mar. 8, 2012, the entire contents of which is incorporated herein by reference for all purposes as if fully set forth herein.

BACKGROUND OF THE INVENTION

1. Field of the Invention

Embodiments of the invention relate to a liquid crystal display, and more specifically, to a liquid crystal display array substrate and a method for manufacturing the same capable of repairing a open circuit failure of data lines.

2. Discussion of the Related Art

Liquid crystal displays are generally driven using optical anisotropy and polarizability of liquid crystals. The liquid crystals have an orientation of molecule arrangement because of their thin and long structure. The liquid crystals may control a direction of molecule arrangement by artificially applying an electric field to the liquid crystals. Thus, if the direction of molecule arrangement of the liquid crystals is arbitrarily adjusted, the molecule arrangement of the liquid crystals may change. Further, light may be refracted in the direction of molecule arrangement of the liquid crystals by the optical anisotropy of the liquid crystals, thereby representing image informations.

Active matrix liquid crystal displays (AMLCD) (hereinafter, abbreviated to "liquid crystal display"), in which thin film transistors and pixel electrodes connected to the thin film transistors are arranged in a matrix form, have been recently spotlighted because of their resolution and an excellent display performance of a video. The liquid crystal display includes a color filter substrate, on which common electrodes are formed, an array substrate, on which pixel electrodes are formed, and liquid crystals interposed between the color filter substrate and the array substrate. The liquid crystal display has excellent characteristics in a transmittance, an aperture ratio, etc. because the liquid crystals are driven by a vertical electric field between the common electrode and the pixel electrode.

However, the drive of the liquid crystals by the vertical electric field results in a reduction in viewing angle characteristics of the liquid crystal display. Thus, an in-plane switching (IPS) mode liquid crystal display having excellent viewing angle characteristics was proposed.

FIG. 1 is a cross-sectional view illustrating a subpixel of a related art IPS mode liquid crystal display.

As shown in FIG. 1, a gate electrode 10 and a gate insulating layer 15 are formed on a first substrate 5, and an active layer 20 is formed on the gate electrode 10. A source electrode 25a and a drain electrode 25b are connected to the active layer 20 to thereby constitute a switching thin film transistor. A data line 25c is formed at an edge of a pixel area, and a pixel electrode 41 connected to the drain electrode 25b is formed. A passivation layer 30 for protecting the components formed on the first substrate 5 is formed, and a common electrode 42 is formed on the passivation layer 30.

A black matrix 55 and a color filter 60 are formed on a second substrate 50, and an overcoat layer 70 covering the black matrix 55 and the color filter 60 is formed on the second substrate 50. A liquid crystal layer 80 is interposed between the first substrate 5 and the second substrate 50. Hence, the IPS mode liquid crystal display is configured through the above-described configuration.

The related art IPS mode liquid crystal display generates a drive failure, for example, the abnormal drive of liquid crystals because of a predetermined voltage difference formed by a coupling capacitance of the common electrode 42 adjacent to the data line 25c.

To solve the above problem, a shield line was formed on the data line to thereby prevent the formation of the voltage difference between the data line and the common electrode. However, when a open circuit failure of the data line was generated, it was difficult to repair the open circuit failure resulting from the shield line positioned on the data line.

SUMMARY OF THE INVENTION

Embodiments of the invention provide a liquid crystal display array substrate and a method for manufacturing the same capable of preventing a drive failure and repairing a open circuit failure of data lines.

In one aspect, there is a liquid crystal display array substrate including a gate line arranged on a substrate in one direction, a data line which crosses the gate line and defines a plurality of pixel areas, a thin film transistor formed at a crossing of the gate line and the data line, a pixel electrode connected to the thin film transistor, and a common electrode which is positioned opposite the pixel electrode and forms an electric field, the common electrode including a shield line overlapping the data line, the shield line including at least two cutting portions having a width less than other portion of the shield line.

In another aspect, there is a liquid crystal display array substrate including a gate line arranged on a substrate in one direction, a data line which crosses the gate line and defines a plurality of pixel areas, a thin film transistor formed at a crossing of the gate line and the data line, a pixel electrode connected to the thin film transistor, and a common electrode which is positioned opposite the pixel electrode and forms an electric field, the common electrode including a shield pattern overlapping the data line, the shield pattern being connected to the data line through at least two contact holes passing through a passivation layer.

In yet another aspect, there is a method for manufacturing a liquid crystal display array substrate including forming a gate line on a substrate in one direction, forming a data line which crosses the gate line and defines a plurality of pixel areas, forming a thin film transistor at a crossing of the gate line and the data line, forming a pixel electrode connected to the thin film transistor, forming a passivation layer on the pixel electrode, forming a common electrode on the passivation layer, the common electrode including a shield line which overlaps the data line and includes at least two cutting portions having a narrow width, irradiating a laser onto the cutting portions positioned at both sides of the shield line overlapping a open portion of the data line and disconnecting the shield line to form a shield pattern, etching both sides of the shield pattern to form contact holes exposing the data line, and forming a contact pattern for filling the contact holes using a laser CVD repair device.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

Figure 1:
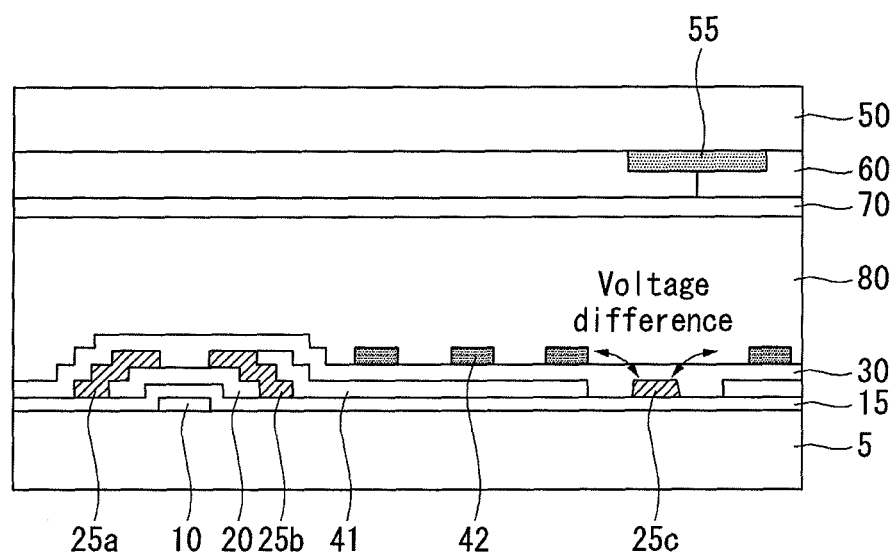
FIG. 1 is a cross-sectional view illustrating a subpixel of a related art in-plane switching (IPS) mode liquid crystal display.
Figure 2:
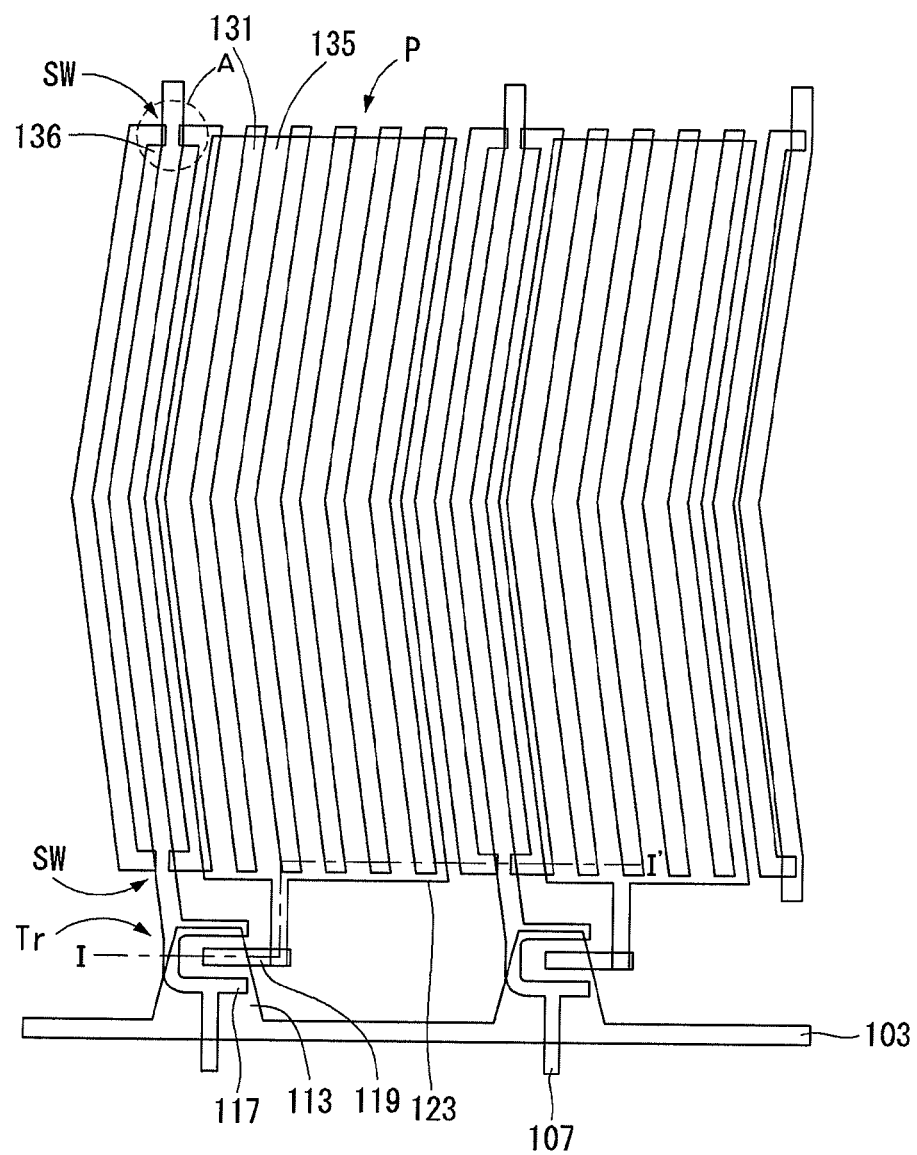
FIG. 2 is a plane view of an IPS mode liquid crystal display according to an example embodiment of the invention.
Figure 3:
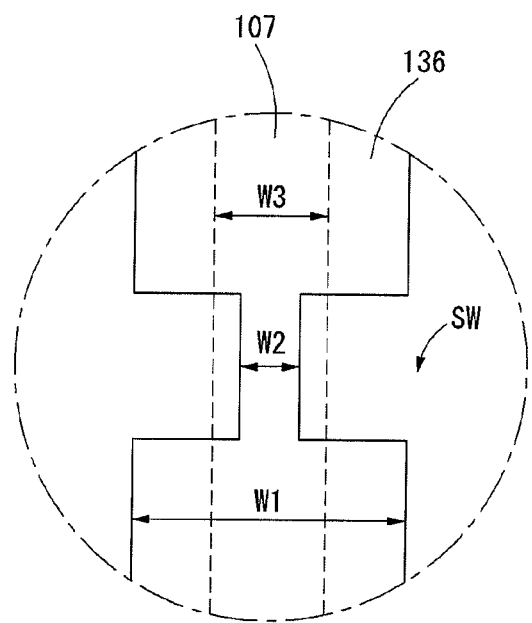
FIG. 3 is an enlarged view of an area 'A' of FIG. 2.

FIG. 2 is a plane view of an in-plane switching (IPS) mode liquid crystal display (LCD) according to an example embodiment of the invention. FIG. 3 is an enlarged view of an area 'A' of FIG. 2. An array substrate and subpixels of the liquid crystal display are shown and described below for the sake of brevity and ease of reading.

As shown in FIG. 2, a plurality of gate lines 103 are positioned on a substrate (not shown) including a plurality of pixel areas P and extend in one direction. A plurality of data lines 107 is positioned to cross the gate lines 103. Hence, the plurality of pixel areas P are defined by crossings of the gate lines 103 and the data lines 107.

A thin film transistor Tr is positioned in each of the pixel areas P. The thin film transistor Tr includes a gate electrode 113 connected to the gate line 103, a gate insulating layer (not shown), a semiconductor layer (not shown), an ohmic contact layer (not shown), a source electrode 117 electrically connected to the data line 107, and a drain electrode 119 separated from the source electrode 117.

FIG. 2 shows the thin film transistor Tr forming an U-shaped channel region. Other shapes may be used for the channel region of the thin film transistor Tr. For example, the thin film transistor Tr may form a I-shaped channel region. Further, FIG. 2 shows that the gate electrode 113 of the thin film transistor Tr protrudes from the gate line 103 to the pixel area P. However, the gate electrode 113 may not protrude from the gate line 103.

In each pixel area P, a plate-shaped pixel electrode 123 is connected to the drain electrode 119 of the thin film transistor Tr. A common electrode 135 is positioned on the entire surface of a display area including the plurality of pixel areas P at a location corresponding to the pixel electrode 123. The common electrode 135 includes a plurality of openings 131 having a bar shape. The common electrode 135 is formed on the entire surface of the display area. In FIG. 2 showing only a plane form of the two pixel areas P, a boundary between the two pixel areas P covers two subpixels P. However, the common electrode 135 is formed on the entire surface of the display area.

The common electrode 135 according to the embodiment of the invention includes a shield line 136 overlapping the data line 107. The shield line 136 prevents an unnecessary electric field from being formed between the data line 107 and the common electrode 135 when the liquid crystal display is driven. An electric field is artificially formed between the shield line 136 and the data line 107, and thus the electric field formed between the data line 107 and the common electrode 135 is reduced.

The shield line 136 and the common electrode 135 form an integral body, and the same electric signal is applied to the shield line 136 and the common electrode 135. The shield line 136 has a line shape similar to the data line 107 and overlaps the most of the data line 107.

The shield line 136 according to the embodiment of the invention may include at least two narrow cutting portions SW in each pixel area P. As shown in FIG. 2, a width of the most of the shield line 136 is greater than a width of the data line 107. However, the shield line 136 includes the cutting portion SW having a width less than the width of the data line 107 at an edge of the pixel area P.

More specifically, as shown in FIG. 3, the shield line 136 has a first width W1 and a second width W2. The first width W1 is greater than a width W3 of the data line 107, and the second width W2 is less than the width W3 of the data line 107. The cutting portion SW of the shield line 136 has the second width W2. The width W2 of the cutting portion SW occupies about 10% to 99% of the width W3 of the data line 107. When the width W2 of the cutting portion SW of the shield line 136 is equal to or greater than about 10% of the width W3 of the data line 107, an increase in a resistance of the common electrode 135 may be prevented because of an increase in a resistance of the shield line 136. When the width W2 of the cutting portion SW of the shield line 136 is equal to or less than about 99% of the width W3 of the data line 107, power of a laser used to cut the cutting portion SW may be reduced in a subsequent line repair process. Hence, a damage of the common electrode 135 positioned around the data line 107 may be prevented.

When a defect, for example, a open circuit of the data line 107 is generated, the cutting portion SW of the shield line 136 serves as a means for repairing the data line 107. A method for repairing the LCD array substrate according to the embodiment of the invention is described in detail below based on a method for manufacturing the LCD array substrate.

Figure 4:
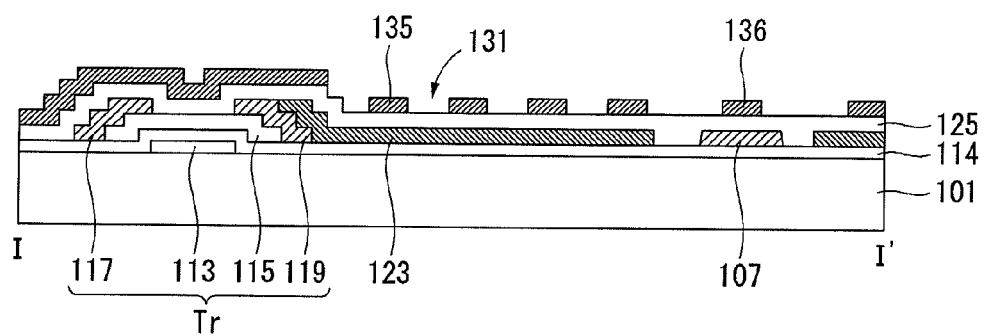
FIG. 4 is a cross-sectional view taken along line I-I' of FIG. 2.

FIG. 4 is a cross-sectional view taken along line I-I' of FIG. 2.

As shown in FIG. 4, in the method for manufacturing the LCD array substrate according to the embodiment of the invention, the gate electrode 113 is formed on the substrate 101 and forms an integral body along with the gate line (not shown) arranged on the substrate 101 in one direction.

A gate insulating layer 114 is positioned on the gate electrode 113 to insulate the gate electrode 113. A semiconductor layer 115 is positioned on the gate insulating layer 114 at a location corresponding to the gate electrode 113. The source electrode 117 and the drain electrode 119 are positioned at both ends of the semiconductor layer 115, respectively. Thus, the thin film transistor Tr including the gate electrode 113, the semiconductor layer 115, the source electrode 117, and the drain electrode 119 is formed.

The pixel electrode 123 electrically connected to the drain electrode 119 of the thin film transistor Tr is positioned on the gate insulating layer 114. The data line 107 connected to the source electrode 117 is formed on the same plane in an area separated from the pixel electrode 123.

A passivation layer 125 is positioned on the substrate 101 including the thin film transistor Tr, the pixel electrode 123, and the data line 107. The common electrode 135 having the plurality of openings 131 is positioned on the passivation layer 125 corresponding to the pixel electrode 123. The shield line 136 electrically connected to the common electrode 135 is positioned at a location corresponding to the data line 107. A cutting portion SW of the shield line 136 is described in FIG. 4.

Accordingly, the LCD array substrate according to the embodiment of the invention is formed. The method for manufacturing the LCD array substrate shown in FIG. 4 is described below.

Figure 5A:
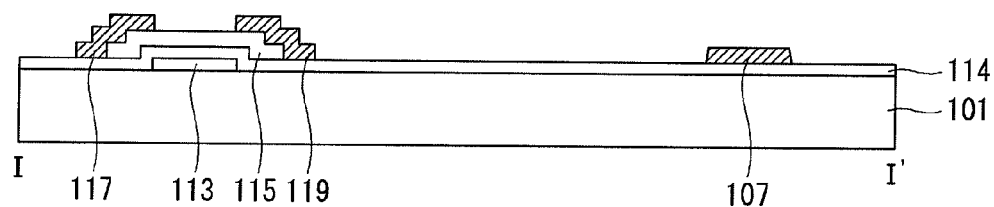
FIGS. 5A and 5B illustrate a method for manufacturing a liquid crystal display array substrate according to an example embodiment of the invention for each stage.
Figure 5B:
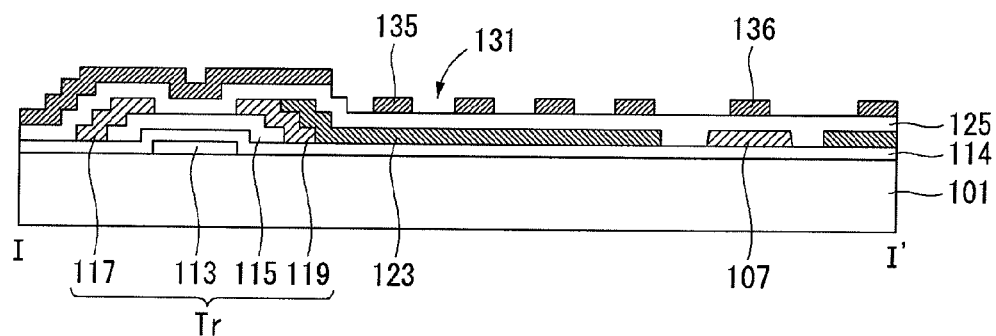

FIGS. 5A and 5B illustrate a method for manufacturing the LCD array substrate according to the embodiment of the invention for each stage.

As shown in FIG. 5A, the method for manufacturing the LCD array substrate according to the embodiment of the invention deposits a metal material having low resistance characteristic, for example, one metal material selected among aluminum (Al), aluminum neodymium (AlNd), copper (Cu), copper alloy, chromium (Cr), and molybdenum (Mo) on the substrate 101. The metal material is patterned to form the gate line (not shown) extending in one direction and the gate electrode 113.

Subsequently, an inorganic insulating material, for example, silicon oxide (SiOx) or silicon nitride (SiNx) is deposited on the entire surface of the substrate 101, on which the gate line and the gate electrode 113 are formed, to form the gate insulating layer 114. Then, amorphous silicon or polycrystalline silicon obtained by crystallizing amorphous silicon is deposited on the substrate 101, on which the gate insulating layer 114 is formed, and is patterned to form the semiconductor layer 115.

A metal material having low resistance characteristic, for example, one metal material selected among aluminum (Al), aluminum neodymium (AlNd), copper (Cu), copper alloy, chromium (Cr), and molybdenum (Mo) is deposited on the substrate 101, on which the semiconductor layer 115 is formed, and is patterned to form the data line 107, the source electrode 117, and the drain electrode 119. In the embodiment of the invention, the semiconductor layer 115 and the source and drain electrodes 117 and 119 are individually formed. Alternatively, amorphous silicon and a metal layer may be sequentially stacked on the substrate 101 and may be simultaneously patterned to simultaneously form the semiconductor layer 115 and the source and drain electrodes 117 and 119.

Next, as shown in FIG. 5B, a transparent conductive material, for example, indium tin oxide (ITO) or indium zinc oxide (IZO) is deposited on the entire surface of the substrate 101 and is individually patterned in each of the pixel areas to form the pixel electrode 123. The pixel electrode 123 is electrically connected to the drain electrode 119 of the thin film transistor Tr.

Subsequently, an inorganic insulating material, for example, silicon oxide (SiOx) or silicon nitride (SiNx) is deposited on the substrate 101, on which the pixel electrode 123 is formed, to form the passivation layer 125. A transparent conductive material, for example, indium tin oxide (ITO) or indium zinc oxide (IZO) is deposited on the entire surface of the substrate 101, and the plurality of openings 131 are formed in each of the pixel areas to form the common electrode 135 and the shield line 136. In this instance, the common electrode 135 is formed in the integral form in the entire display area of the substrate 101

The LCD array substrate according to the embodiment of the invention is manufactured through the above-described process. A method for repairing the data line of the LCD array substrate thus manufactured is described below.

FIGS. 6A to 9B illustrate a method for repairing the LCD array substrate according to the embodiment of the invention for each stage. More specifically, FIGS. 6A, 7A, 8A, and 9A are plane views of the data line and the shield line of FIG. 2, and FIGS. 6B, 7B, 8B, and 9B are cross-sectional views taken along line II-IP of FIGS. 6A, 7A, 8A, and 9A, respectively.

Figure 6A:
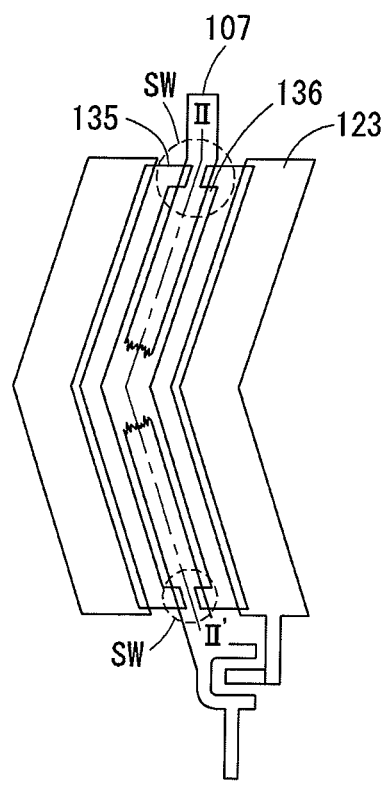
FIG. 6A is a plane view of a data line and a shield line of FIG. 2.
Figure 6B:
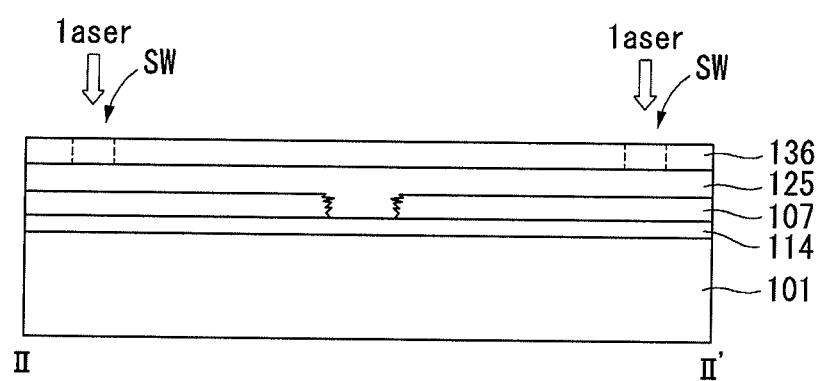
FIG. 6B is a cross-sectional view taken along line II-II' of FIG. 6A.

As shown in FIGS. 6A and 6B, when the open circuit of a portion of the data line 107 is found in a test process of the LCD array substrate thus manufactured, the embodiment of the invention causes the cutting portion SW of the shield line 136 corresponding to the open data line 107 to be disconnected.

More specifically, a laser is irradiated onto each of the cutting portions SW positioned on both sides of the open portion of the data line 107, thereby disconnecting the shield line 136 connected to the common electrode 135. A deep UV laser may be used to disconnect the shield line 136. Other lasers may be used. In particular, because each cutting portion SW of the shield line 136 has the width less than other portion of the shield line 136, the shield line 136 may be easily disconnected by irradiating a laser with low power onto the cutting portions SW having the narrow width. Hence, the embodiment of the invention may prevent a damage of the common electrode generated when a related art shield line having a wide width is disconnected using a laser with high power.

Figure 7A:
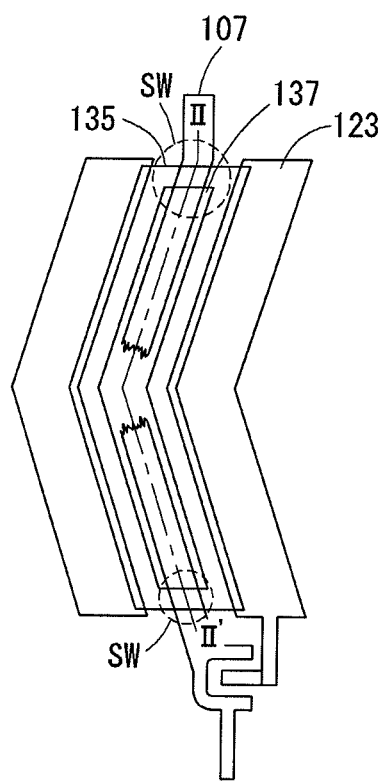
FIG. 7A is a plane view of a data line and a shield line of FIG. 2.
Figure 7B:
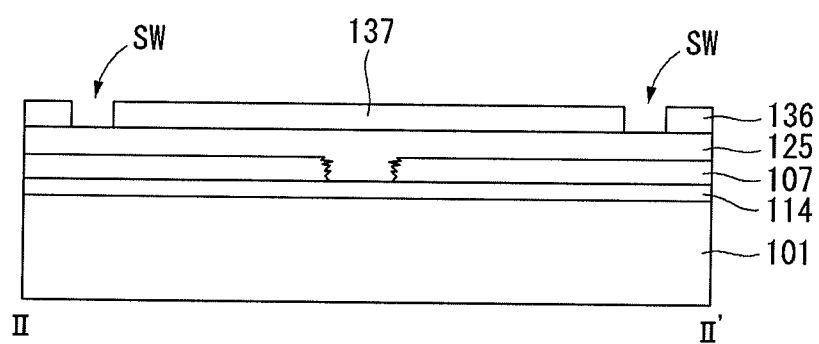
FIG. 7B is a cross-sectional view taken along line II-IP of FIG. 7A.

Accordingly, as shown in FIGS. 7A and 7B, a shield pattern 137 is formed by the shield line 136 disconnected from the common electrode 135. The shield pattern 137 has an island pattern and is positioned in the open portion of the data line 107.

Figure 8A:
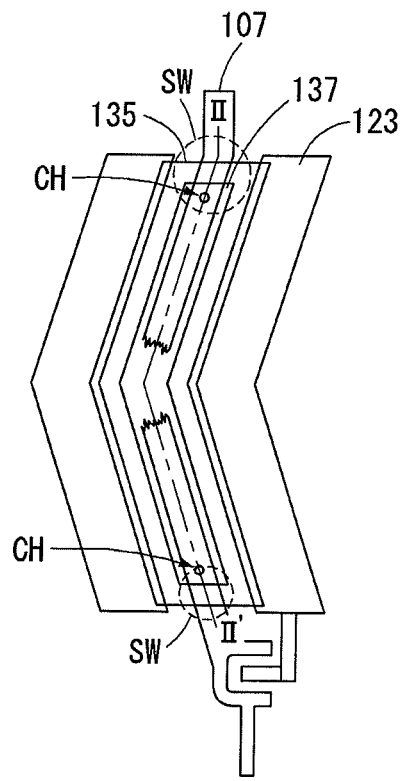
FIG. 8A is a plane view of a data line and a shield line of FIG. 2.
Figure 8B:
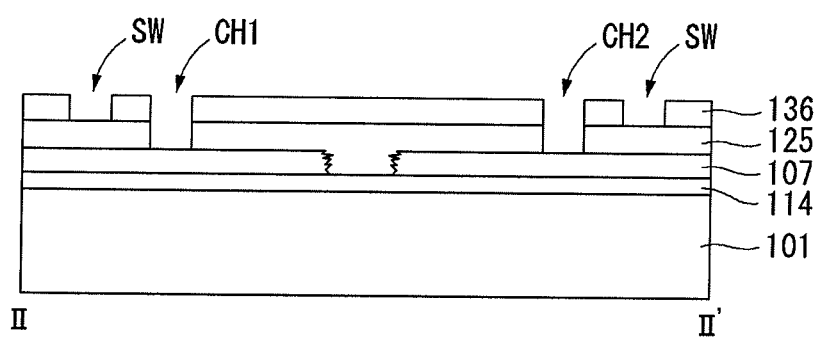
FIG. 8B is a cross-sectional view taken along line II-IF of FIG. 8A.

Next, as shown in FIGS. 8A and 8B, the laser is irradiated onto both sides of the shield pattern 137 adjacent to the open portion of the data line 107, i.e., both ends of the data line 107 to form a first contact hole CH1 and a second contact hole CH2. In this instance, the laser used to form the first and second contact holes CH1 and CH2 is different from the laser used to disconnect the shield line 136 in laser irradiation conditions such as a source, a focus, power, and radiation time for generating the laser. The inorganic insulating material (or organic insulating material) or the metal material is burned and removed by properly adjusting the laser irradiation conditions. Alternatively, only the inorganic insulating material may be selectively burned and removed. Thus, the first contact hole CH1 and the second contact hole CH2 exposing the data line 107 may be formed by irradiating the laser onto the substrate 101 under the properly adjusted laser irradiation conditions.

Figure 9A:
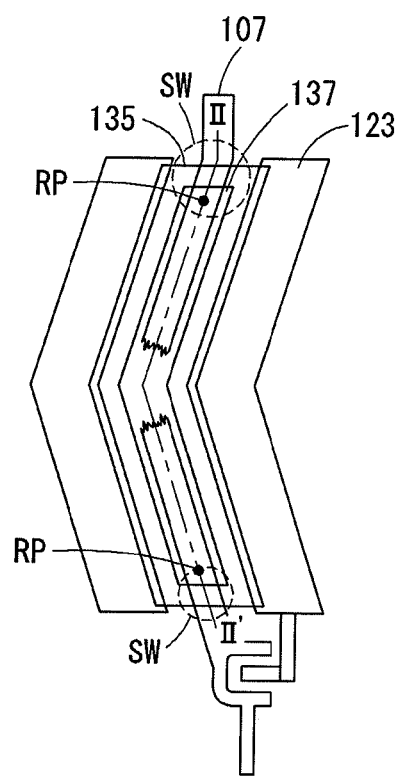
FIG. 9A is a plane view of a data line and a shield line of FIG. 2.
Figure 9B:
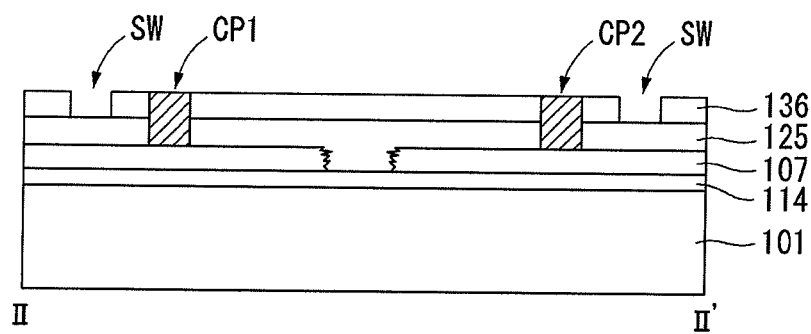
FIG. 9B is a cross-sectional view taken along line II-IP of FIG. 9A.

Next, as shown in FIGS. 9A and 9B, a first contact pattern CP1 is formed at a location corresponding to the first contact hole CH1 exposing the data line 107 using a CVD repair device using the laser to fill the first contact hole CH1. Subsequently, a second contact pattern CP2 is formed at a location corresponding to the second contact hole CH2 exposing the data line 107 using the CVD repair device to fill the second contact hole CH2. Thus, the open portions of the data line 107 are electrically connected to each other through the shield pattern 137. As a result, the data line 107 may be repaired.

As described above, the method for manufacturing the LCD array substrate according to the embodiment of the invention may prevent a damage of periphery components resulting from the use of the laser, because the laser with low power may be used in the repair process through the formation of the cutting portion of the shield line overlapping the data line.

A shape of a black matrix in the LCD array substrate according to the embodiment of the invention may change, so as to prevent a light leakage phenomenon resulting from the cutting portion of the shield line.

Figure 10:
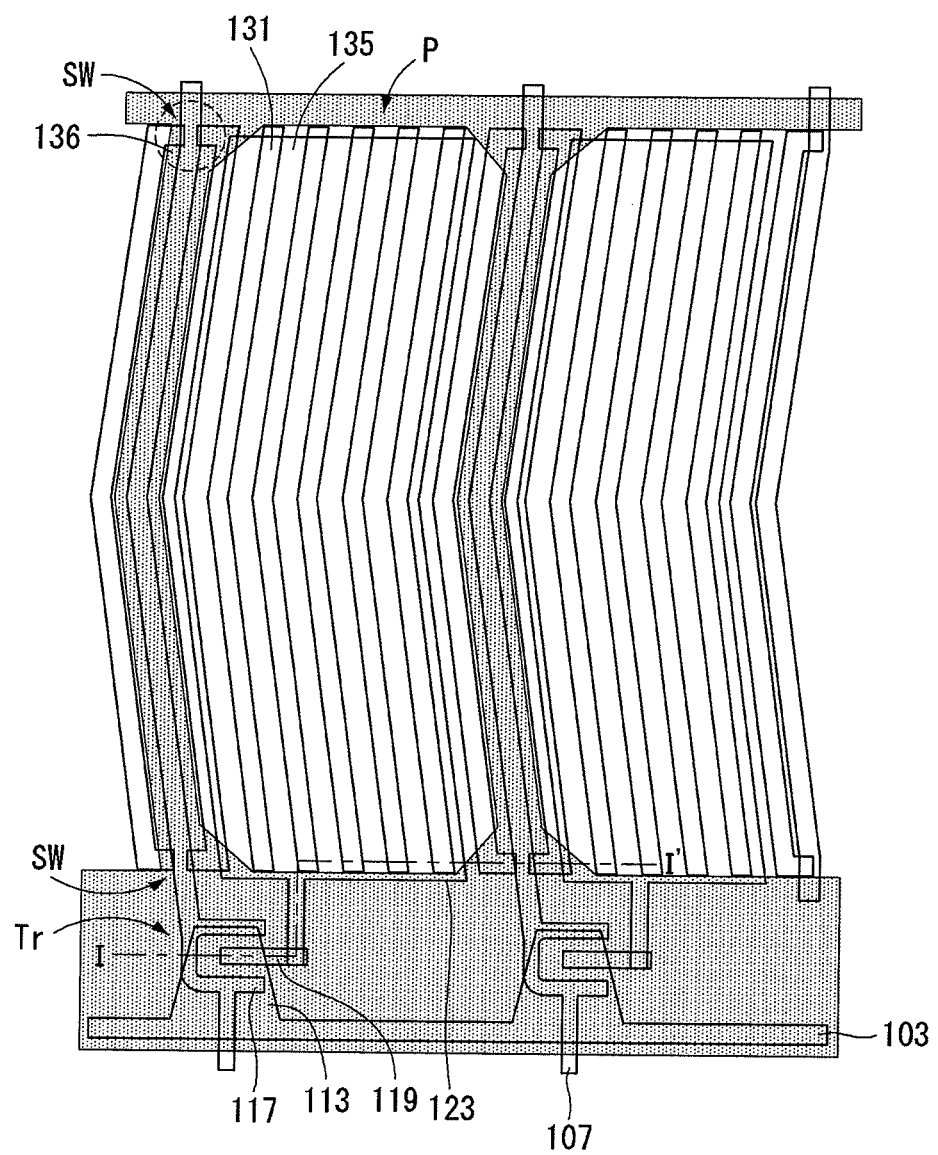
FIG. 10 is a plane view illustrating a shape of a black matrix of a liquid crystal display array substrate according to an example embodiment of the invention.

FIG. 10 is a plane view illustrating a shape of a black matrix of the LCD array substrate according to the embodiment of the invention. FIG. 10 shows only an area of a black matrix shown in FIG. 2.

Next, as shown in FIG. 10, a black matrix BM formed on a color filter array substrate (not shown) covers signal lines and element areas including the data line 107, the thin film transistor Tr, the gate line 103, etc. The black matrix BM generally has a shape opening the pixel electrode.

In the embodiment of the invention, the black matrix BM is formed to cover the signal lines and the element areas in an area adjacent to the cutting portion SW of the shield line 136. Namely, the black matrix BM is formed to further protrude in the area adjacent to the cutting portion SW, so as to prevent the light leakage phenomenon resulting from the cutting portion SW from being generated in the area adjacent to the cutting portion SW. In other words, the black matrix BM is formed to protrude to the inside of the pixel area P at an edge of the pixel electrode 123 adjacent to the cutting portion SW of the shield line 136.

As described above, the embodiment of the invention may prevent the light leakage phenomenon resulting from the cutting portion of the shield line by changing the structure of the black matrix BM.

The following Table 1 indicates a failure percentage in the repair process of the related art LCD array substrate and a failure percentage in the repair process of the LCD array substrate according to the embodiment of the invention with respect to each model.

TABLE 1

| Model | Related art repair method | | | Repair method according to the embodiment of the invention | | |
|---|---|---|---|---|---|---|
| | Number of tested data lines | Number of defect data lines | Failure percentage | Number of tested data lines | Number of defect data lines | Failure percentage |
| A | 15921 | 119 | 0.75% | 25584 | 4 | 0.02% |
| B | 288349 | 1335 | 0.46% | 251880 | 34 | 0.01% |
| C | 266150 | 1193 | 0.45% | 13636 | 6 | 0.04% |
| D | 106387 | 1183 | 1.11% | 46050 | 19 | 0.04% |
| E | 10019 | 41 | 0.41% | 1248 | 0 | 0.00% |

As indicated by the above Table 1, when the repair process for solving the open circuit of the related art data line was performed, the failure percentage was about 0.41% to 1.11%. On the other hand, when the repair process was performed by forming the cutting portion on the shield line according to the embodiment of the invention, the failure percentage was greatly reduced to about 0.00% to 0.04%.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A liquid crystal display array substrate comprising:
    a gate line arranged on a substrate in one direction;
    a data line which crosses the gate line and defines a plurality of pixel areas;
    a thin film transistor formed at a crossing of the gate line and the data line;
    a pixel electrode connected to the thin film transistor; and
    a common electrode which is positioned opposite the pixel electrode and forms an electric field, the common electrode including a shield line overlapping the data line, the shield line including at least two cutting portions having a width less than other portion of the shield line,
    wherein the shield line is electrically connected to the common electrode.

2. The liquid crystal display array substrate of claim 1, wherein the common electrode and the shield line form an integral body.

3. The liquid crystal display array substrate of claim 1, wherein a width of the shield line is greater than a width of the data line.

4. The liquid crystal display array substrate of claim 1, wherein the width of each cutting portion of the shield line is less than the width of the data line.

5. The liquid crystal display array substrate of claim 1, wherein the at least two cutting portions of the shield line are formed in one pixel area.

6. A liquid crystal display array substrate comprising:
    a gate line arranged on a substrate in one direction;
    a data line which crosses the gate line and defines a plurality of pixel areas;
    a thin film transistor formed at a crossing of the gate line and the data line;
    a pixel electrode connected to the thin film transistor; and
    a common electrode which is positioned opposite the pixel electrode and forms an electric field, the common electrode including a shield pattern overlapping the data line, the shield pattern being connected to the data line through at least two contact holes passing through a passivation layer,
    wherein the shield pattern has an island pattern and is positioned in an open portion of the data line, and one end of the open portion of the data line and the other end of the open portion of the data line are electrically connected to each other through the shield pattern.

7. The liquid crystal display array substrate of claim 6, wherein both sides of the shield pattern are cut and are separated from the common electrode.

8. The liquid crystal display array substrate of claim 6, wherein the shield pattern is positioned on the passivation layer, and the passivation layer is positioned on the data line.

9. The liquid crystal display array substrate of claim 6, wherein the shield pattern is connected to the data line by a contact pattern filled in the at least two contact holes.

10. The liquid crystal display array substrate of claim 1, further comprising:
    a black matrix formed in an area adjacent to the cutting portions, the black matrix covering signal lines and element areas including the data line, the thin film transistor, the gate line, and having a shape opening the pixel electrode, and formed to further protrude in the area adjacent to the cutting portions.

11. A method for manufacturing a liquid crystal display array substrate, the method comprising:

forming a gate line on a substrate in one direction;

forming a data line which crosses the gate line and defines a plurality of pixel areas;

forming a thin film transistor at a crossing of the gate line and the data line;

forming a pixel electrode connected to the thin film transistor;

forming a passivation layer on the pixel electrode;

forming a common electrode on the passivation layer, the common electrode including a shield line which overlaps the data line and includes at least two cutting portions having a narrow width, wherein the shield line is electrically connected to the common electrode;

irradiating a laser onto the cutting portions positioned at both sides of the shield line overlapping a open portion of the data line and disconnecting the shield line to form a shield pattern;

etching both sides of the shield pattern to form contact holes exposing the data line; and forming a contact pattern for filling the contact holes using a laser CVD repair device.

12. The method of claim 11, wherein the disconnecting of the shield line uses a deep UV laser.

* * * * *

UNITED STATES PATENT AND TRADEMARK OFFICE
CERTIFICATE OF CORRECTION

| | | |
|---|---|---|
| PATENT NO. | : 8,653,521 B2 | Page 1 of 1 |
| APPLICATION NO. | : 13/546710 | |
| DATED | : February 18, 2014 | |
| INVENTOR(S) | : Jeongwoo Hwang et al. | |

It is certified that error appears in the above-identified patent and that said Letters Patent is hereby corrected as shown below:

ON THE TITLE PAGE:

At item (30), correct the Foreign Priority Application Data to read as follows:

--Mar. 8, 2012     (KR) ........................ 10-2012-0023989--.

Signed and Sealed this
Fourteenth Day of October, 2014

Michelle K. Lee
*Deputy Director of the United States Patent and Trademark Office*